(12) United States Patent
Mahar et al.

(10) Patent No.: US 8,539,406 B2
(45) Date of Patent: Sep. 17, 2013

(54) EQUIVALENCE CHECKING FOR RETIMED ELECTRONIC CIRCUIT DESIGNS

(76) Inventors: Michael Mahar, Amherst, NH (US);
Pradish Mathews, Greater Noida (IN);
James Henson, Bend, OR (US);
Anant-Kumar Jain, Madhya Pradesh (IN)

(*) Notice: Subject to any disclaimer, the term of this patent is extended or adjusted under 35 U.S.C. 154(b) by 86 days.

(21) Appl. No.: 13/018,229

(22) Filed: Jan. 31, 2011

(65) Prior Publication Data
US 2012/0198398 A1 Aug. 2, 2012

(51) Int. Cl.
*G06F 17/50* (2006.01)
*G06F 9/45* (2006.01)

(52) U.S. Cl.
USPC ............ 716/107; 716/103; 716/104; 716/106

(58) Field of Classification Search
USPC .......................... 716/101, 103, 104, 106, 107
See application file for complete search history.

(56) References Cited

U.S. PATENT DOCUMENTS

| | | | | |
|---|---|---|---|---|
| 5,018,082 A | * | 5/1991 | Obata et al. ................ | 715/707 |
| 6,687,882 B1 | * | 2/2004 | McElvain et al. ............ | 716/103 |
| 6,851,102 B2 | * | 2/2005 | Tsuchiya ..................... | 716/103 |
| 7,219,312 B2 | * | 5/2007 | Tsuchiya ..................... | 716/103 |
| 7,519,939 B2 | * | 4/2009 | Tsuchiya ..................... | 716/132 |
| 7,890,901 B2 | * | 2/2011 | Gemmeke et al. ........... | 716/106 |

* cited by examiner

*Primary Examiner* — Sun Lin
(74) *Attorney, Agent, or Firm* — Mentor Graphics Corporation (57) ABSTRACT

Techniques and technology for formally verifying a first electronic design with a second electronic design that has been synthesized from the first electronic design, wherein the synthesis process included structural transformation operations, is provide herein. In various implementations, a first design and a second design are received. The second design having been synthesized from the first design, where no structural transformation operations were performed during synthesis of the second design. Additionally, a third design and a structural transformation guidance file are received. The third design having also been synthesized from the first design, but, where structural transformation operations were performed during synthesis of the third design. The structural transformation guidance file specifies what transformations where made during synthesis. Subsequently, a first formal verification process is implemented to verify the equivalence of the first design to the second design using conventional formal verification proofs. A modified second design is then generated, by applying changes to the second design to correspond to the structural transformations detailed in the structural transformation guidance file. After which, a second formal verification process is implemented to verify the equivalence of the third design and the modified second design.

12 Claims, 7 Drawing Sheets

EQUIVALENCE CHECKING FOR RETIMED ELECTRONIC CIRCUIT DESIGNS

FIELD OF THE INVENTION

The present invention is directed towards the field of formal electronic design verification. More particularly, the present invention is directed towards formally verifying an electronic circuit design that has been retimed.

BACKGROUND OF THE INVENTION

Electronic circuits are used in a variety of products, from automobiles to microwaves to personal computers. Designing and fabricating electronic circuits and devices that encompass these circuits typically involves many steps, sometimes referred to as the "design flow." The particular steps of a design flow often are dependent upon the type of electronic circuit, its complexity, the design team, and the electronic circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, a specification describing the desired functionally for a new circuit is generated. Subsequently, the specification is transformed into a logical design, sometimes referred to as a register transfer level (RTL) description of the circuit. With this logical design, the circuit is described in terms of both the exchange of signals between hardware registers and the logical operations that are performed on those signals. The logical design is typically embodied in a Hardware Design Language (HDL), such as the Very high speed integrated circuit Hardware Design Language (VHDL). At this point, the logic of the circuit is often analyzed, to confirm that it will accurately perform the functions described in the specification. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams and is often referred to as a "gate-level" design. The relationships between the electronic devices specified by the gate-level design are then analyzed, often mathematically, to confirm that the circuit described by the gate-level design corresponds to the circuit described by the register transfer level design. This analysis is typically referred to as "formal verification."

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Lines are then routed between the geometric elements, which will form the wiring used to interconnect the geometric components and form the electronic devices specified by the gate-level design. After the layout design is completed, the design can be manufactured into a circuit via an appropriate manufacturing process, such as, for example, an optical lithographic process.

As indicated, verification processes often take place after a "higher-level" design has been synthesized into a "lower-level" design, such as, for example, synthesizing a gate-level design from a register transfer level design. These verification processes seek to ensure that the synthesized design is logically equivalent to the design from which it was synthesized. In the case of formal verification, mathematical theorems are used to determine if the two designs are logically equivalent. However, some operations carried out during synthesis, such as, for example, retiming operations, may cause conventional formal verification methods to fail even where the two designs are logically equivalent. This is due to the fact that, in order to determine logical equivalence, conventional formal verification techniques rely on the structural similarity of the two designs. As such, where structural transformations are made to a design during synthesis, conventional techniques are insufficient to formally verify these designs. As those of skill in the art will appreciate, modern synthesis processes often include structural transformation operations. In many cases, the structural transformation operations, such as, for example, retiming, are done to meet design or manufacturing constraints. Some example of structural transformation techniques are, retiming, state minimization, state encoding, sequential-redundancy removal, redundancy removal and addition.

One proposed technique to formally verify structurally transformed designs is referred to as sequential equivalence checking, which is discussed in detail in *Principles of Sequential-Equivalence Verification*, by Maher N. Mneimneh and Karem A. Sakallah, Design and Test of Computers, pp. 248-257, vol. 22, issue 3, 2005, which article is incorporated entirely herein by reference. As those of skill in the art will appreciate, sequential equivalence checking requires traversing the state space of the two designs prior to verification. As such, sequential equivalence checking techniques require significantly more computational resources than conventional formal verification techniques require. Furthermore, the state space of the design must be traversed during sequential equivalence checking. As those of skill in the art will appreciate, the state space increases exponentially with the size of the circuit design. As a result, it is often not feasible to formally verify a design using sequential techniques due to the size of the state space.

BRIEF SUMMARY OF THE INVENTION

Equivalence checking of structurally transformed designs using conventional formal verification proofs is provided.

In various implementations, a first design and a second design are provided, where the second design having been synthesized from the first design, and where no structural transformation operations were performed during synthesis of the second design. Additionally, a third design and a structural transformation guidance file are provided, the third design having also been synthesized from the first design, but where structural transformation operations were performed during synthesis of the third design. A structural transformation guidance file specifies what transformations where made during synthesis.

Subsequently, a first formal verification process is implemented to verify the equivalence of the first design to the second design using conventional formal verification proofs. A modified second design is then generated, by applying changes to the second design to correspond to the structural transformations detailed in the structural transformation guidance file. After which, a second formal verification process is implemented to verify the equivalence of the third design and the modified second design.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are typically high-level abstractions of the actual operations that are performed. The actual operations that correspond to these terms will often vary depending on the particular implementation.

Furthermore, in various implementations, a mathematical model may be employed to represent an electronic device. Those of ordinary skill in the art will appreciate that the models, even mathematical models represent real world physical device designs and real world physical phenomenon corresponding to the operation of the device. Additionally, those of ordinary skill in the art will appreciate that during many electronic design and verification processes, the response of a device design to various signals or inputs is simulated. This simulated response corresponds to the actual physical response the device being modeled would have to these various signals or inputs. Many of the methods and operations described herein make changes to the design of an electronic device or, as stated above, derive responses of the design to a set of given conditions or inputs.

Some of the methods described herein can be implemented by software instructions stored on a computer readable storage medium, executed on a computer, or some combination thereof. More particularly, some of the disclosed methods may be implemented as part of a computer implemented electronic design automation ("EDA") tool. The selected methods could be executed on a single computer or a computer networked with another computer or computers. The computer-executable instructions embodying the software, which as stated are stored on one or more computer-readable media, are typically stored in a non-transient manner. More specifically the instructions are stored in such a manner that they may be read or provided to a computational device as needed to execute the software. Additionally, any modified designs or derived responses generated by execution of the software are typically stored on one or more computer-readable media in a non-transient manner. In this manner, the modified design or derived response can then be provided for, or accessed by, a user of the tool.

Illustrative Computing Environment

Figure 1:
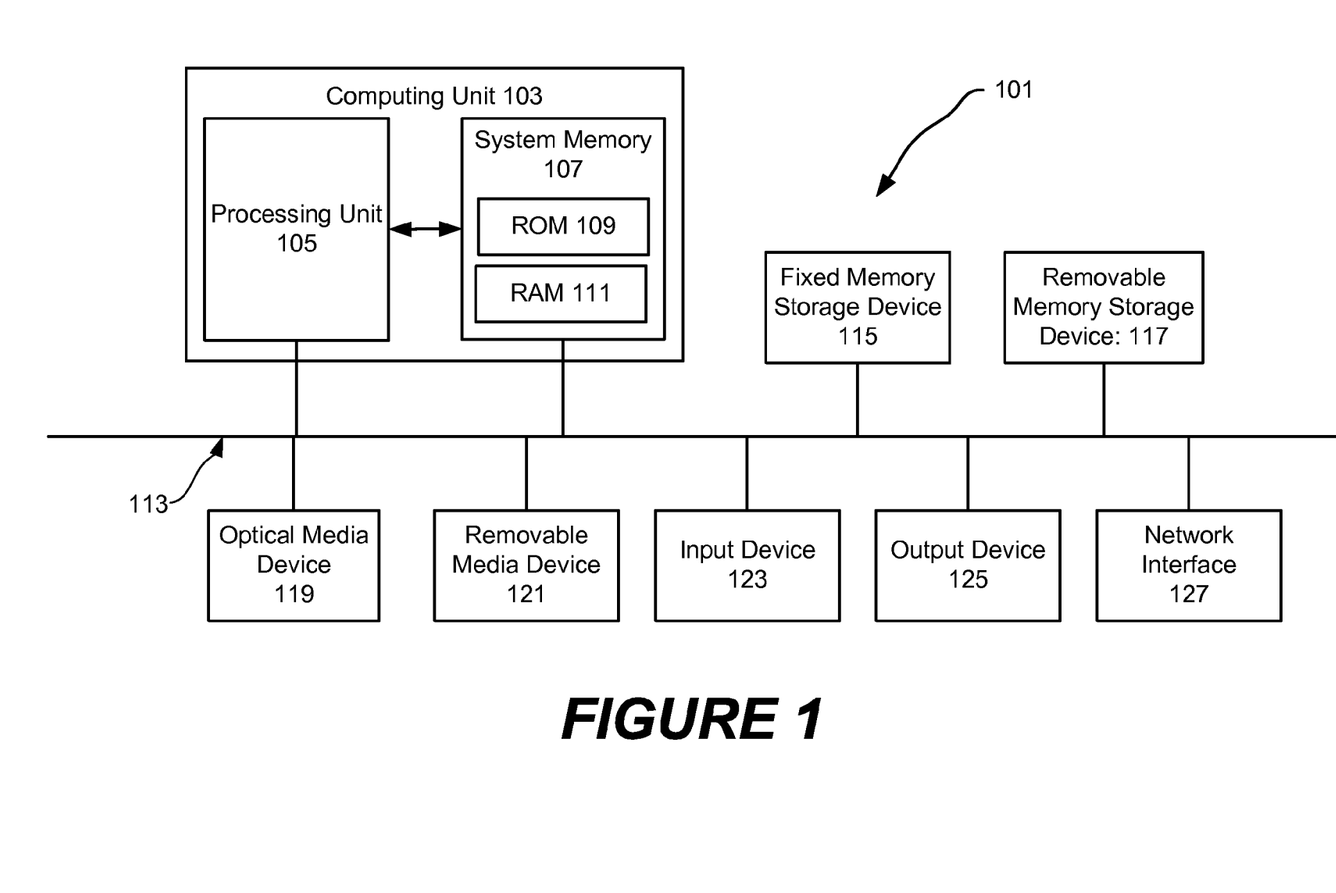
FIG. 1 illustrates a computing device that may be used to facilitate various implementations of the present invention.

As the techniques of the present invention may be implemented using software instructions, the components and operation of a computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Formal Verification

Figure 2:
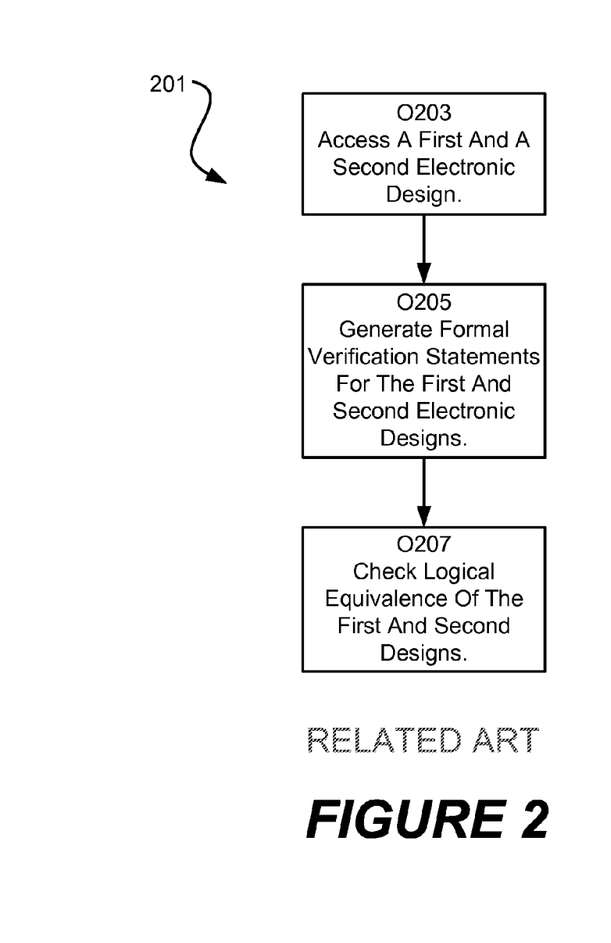
FIG. 2 shows a conventional formal verification method.

As introduced above, formal verification is the process of determining if an electronic design conforms to some specified functionality by application of mathematical proofs. In many implementations, formal verification techniques are often applied to determine if two electronic designs are logically equivalent. More specifically, two electronic designs are checked to determine if their behavior, often expressed as their outputs corresponding to a set of inputs, match. If the electronic designs generate the same outputs for a given set of inputs, they are said to be equivalent. FIG. 2 illustrates a conventional formal verification method 201. With some implementations, the method 201 may be carried out in conjunction with a formal verification tool, such as, for example, the tool 301 illustrated in FIG. 3. Reference to both FIG. 2 and FIG. 3 will be made in describing the conventional formal verification techniques and tools below.

Figure 3:
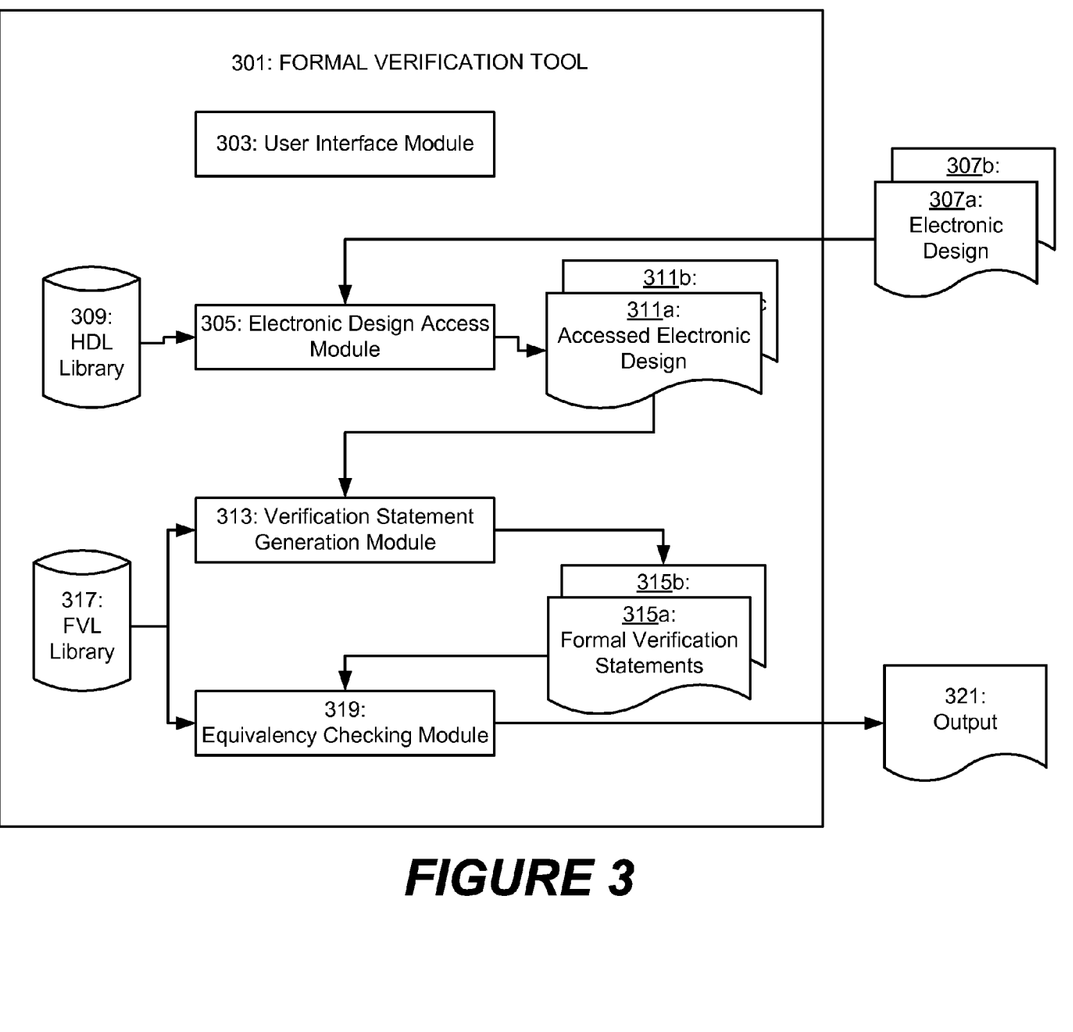
FIG. 3 illustrates a formal verification tool 301 that may be implemented to perform the method of FIG. 2.

As can be seen, the method 201 includes an operation 203 for accessing a first electronic design and a second electronic design. As used herein, an electronic design may be any description that defines the components and configuration for an electronic device. Various types of electronic devices can be formally verified by the method 201 and the tool 301, for example, an integrated circuit (IC) and a field programmable gate array (FPGA) are just two such devices. The electronic designs will typically be described in a hardware description language and be represented at either the register transfer level or the gate-level. In many cases, one electronic design will be represented at a high-level of abstraction, such as, for example, the register transfer level, while the other design will be represented at a low-level of abstraction, such as, for example, the gate-level.

The tool 301 includes a user interface module 303 configured to interact with a user of the tool 301. In various implementations, the user interface module 303 may be a graphical display configured to receive inputs from a user and display outputs to a user. With other implementations, the user interface module 303 may be configured to receive inputs from a user and provide outputs to the user through text, such as, for example, by displaying the text on a display device, or printing the text to a printing device. In many implementations, the user interface module 303 receives instructions from a user specifying a first electronic design 307a and a second electronic design 307b to be accessed by the tool 301. After which, the user interface module 303 will cause the tool 301 to access the specified designs. The tool 301 also includes an electronic design access module 305 and a hardware description language library 309, which are configured to access the electronic designs 307.

In various implementations, the module 305 accesses the electronic designs 307 by reading descriptions corresponding to the designs 307 from a source. Subsequently, the module 305 may format the designs 307 to be readable by the tool 301, based upon rules stored within the library 309. After which, the module 305 will save the formatted designs to a memory storage location accessible by the tool 301, resulting in a first accessed electronic design 311a and a second accessed electronic design 311b.

The method 201 additionally includes an operation 205 for generating formal verification statements corresponding to the first electronic design and formal verification statements corresponding to the second electronic design. Formal verification statements describe the operation of a circuit at various points, often referred to as "comparison points," within the circuit. As detailed above, formal verification processes seek to ensure that two electronic designs are logically equivalent. More specifically, given a set of inputs, if the outputs from each design corresponding to that set of inputs match, the verification checks are successful. Accordingly, various points within the designs are selected as points for comparison between designs. These points are often referred to as comparison points. The comparison points may be selected by a user or may be determined by the tool 301, by, for example, setting the comparison points to be between each register, or between selected registers, or at other points within the design. Then, the logical equivalence of the circuit is verified at the main outputs of the device as well as at these comparison points. In this manner, the logical equivalence between the two designs can be ensured.

The tool 301 includes a verification statement generation module 313 configured to generate formal verification statements 315 for a design 307. As can be seen, the module 313 is shown having generated a first set of formal verification statements 315a and a second set of formal verification statements 315b, corresponding to the first and second electronic designs 307 respectively. In various implementations, the module 313 generates a set of formal verification statements 315 by taking an accessed design 311, identifying comparison points within the accessed design 311, and then forming statements that describe the operation of the accessed design 311 at these comparison points based upon the formal verification library 317.

Figure 4:
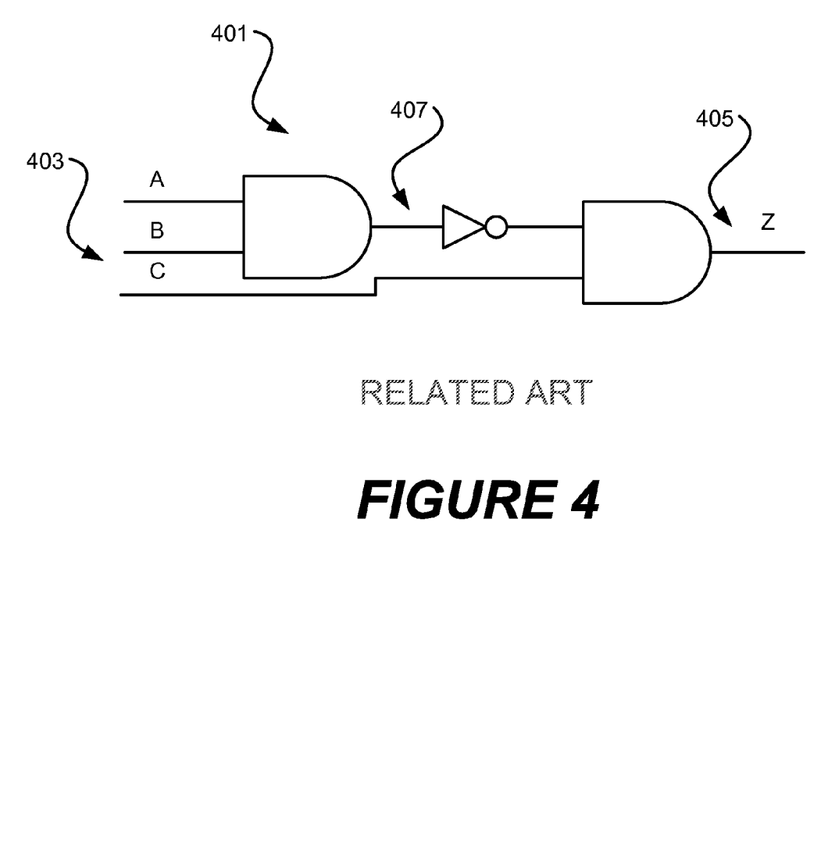
FIG. 4 shows a circuit design.

Although those of ordinary skill in the art will be capable of generating formal verification statements for an electronic design, an illustrative formal verification statement for a simple electronic design is shown herein. FIG. 4 illustrates a simple circuit 401 having inputs 403A, 403B, and 403C, an output 405Z, and a comparison point 407. The operation of the circuit 401 may be described by the following statements, where P corresponds to the comparison point 407.

$$A \wedge B = P$$

$$\neg P \wedge C = Z$$

In various implementations, the above statements may be generated by the module 313 from a description of the circuit 401. Those of skill in the art will appreciate that various ways to describe the logical behavior of an electronic design, at various points within the design, are available. The example illustrated above is provided for clarity of explanation only and other equally suitable methods of describing the logical behavior may be substituted for the above example without departing from the sprit and scope of the claimed invention. As such, the module 313 may use other conventions than those illustrated above for the statements 315.

Returning to the method 201, an operation 207 for checking the equivalency of the first design and the second design by mathematically verifying the equivalence of the two designs is also provided. An equivalency checking module 319, which is configured to check the equivalency of two sets of formal verification statements 315, is included in the tool 301. In various implementations, the equivalency is verified by application of logical proofs stored in the formal verification library 317 to the two sets of formal verification statements 315. Conventional formal verification techniques are discussed in greater detail in *Formal Methods for Verification of Digital Circuits*, C. A. J. Van Eijk et al., Prof. Dr. M. Rem et al., Eindhoven Univ. Technol., 1997, which article is incorporated entirely herein by reference.

Where the first set of formal verification statements 315a and the second set of formal verification statements 315b are shown to be logically equivalent, it follows that the electronic designs 307 corresponding to the two sets of formal verification statements 315 are also logically equivalent. Conversely, where the two sets of formal verification statements 315 are shown to not be logically equivalent, it follows that the electronic designs 307 corresponding to the two sets of formal verification statements 315 are also not logically equivalent. In various implementations, the module 319 is configured to generate an output 321 that details the results of the equivalency check for a user of the tool 301.

As indicated above, conventional formal verification techniques rely on the structural similarity of the two designs to verify the logical equivalence. More specifically, as detailed, the formal verification statements 315 describe the design at various points (i.e. "the comparison points," such as, for example, the comparison point 407 of FIG. 4) within the design. However, many synthesis operations perform some type of structural transformation during the synthesis process. As a result, formal verification will often fail, even where the two designs are actually logically equivalent, due to the fact that the designs are not structurally identical at some of the comparison points.

As stated, there are many reasons why structural transformations may take place during synthesis, retiming operations being one of those reasons. The following illustrative implementations of the invention are discussed in the context of retiming operations. However, various implementations of the invention may be equally applicable to synthesis operations that structurally transform a design for other reasons as well, such as, for example, state minimization, state encoding, sequential-redundancy removal, or redundancy removal and addition.

Retiming is an optimization technique that moves the registers or combinational logic gates of a design to optimize timing and area. In some cases retiming is required in order for the design to comply with timing constraints, such as, for example, fan-out. In other cases, retiming is required for the design to comply with manufacturing constraints. Although retiming typically does not change the behavior of the circuit at the primary inputs and outputs of the circuit, the location, contents, and names of registers in the design are often changed. As such, conventional formal verification techniques, which rely on the structural similarity of the designs, are not suitable for performing equivalency verification of the two designs.

Formal Verification for Retimed Electronic Designs

Figure 5:
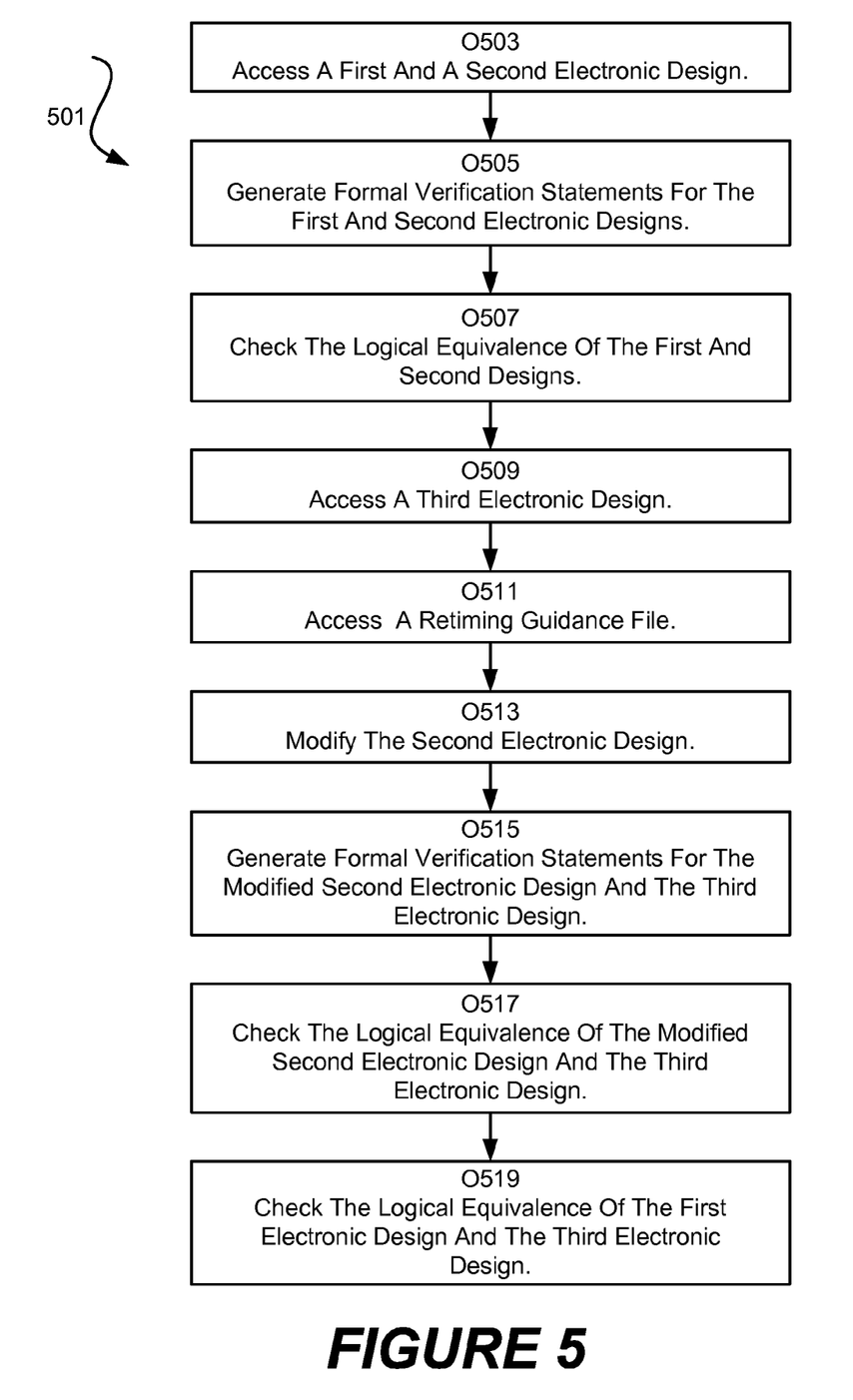
FIG. 5 shows a formal verification method that may be applied to formally verify a structurally transformed design.
Figure 6:
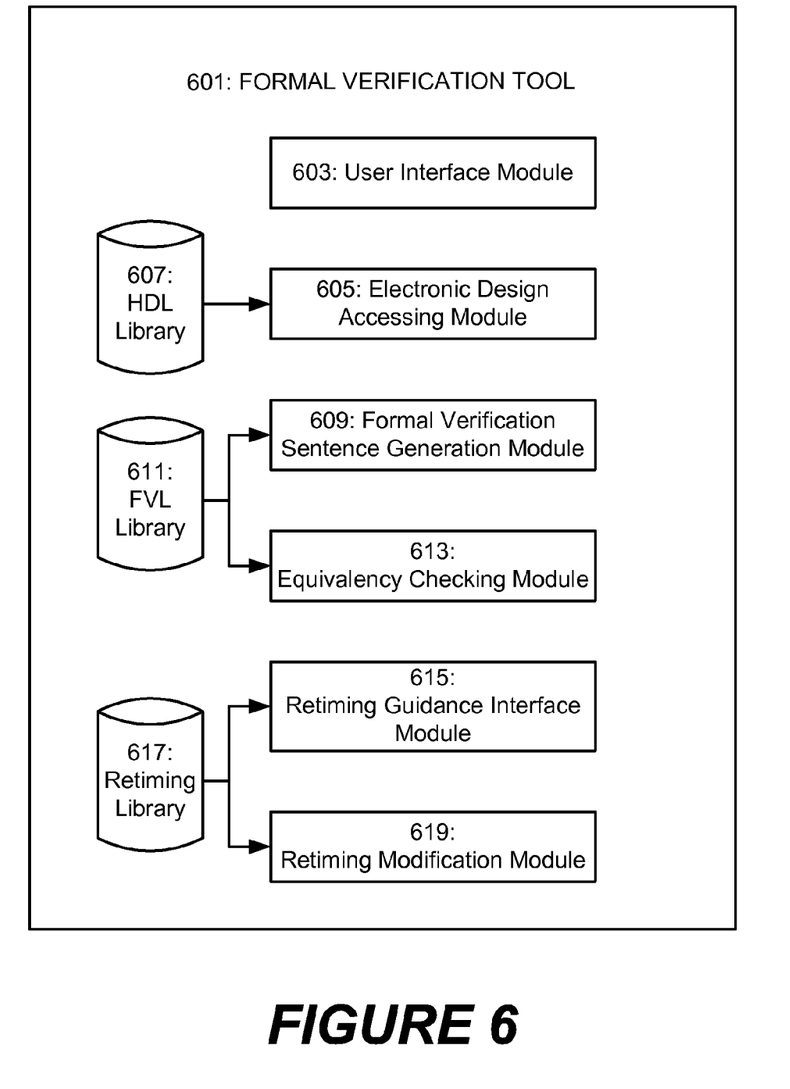
FIG. 6 illustrates a formal verification tool that may be implemented to perform the method of FIG. 5.
Figure 7A:
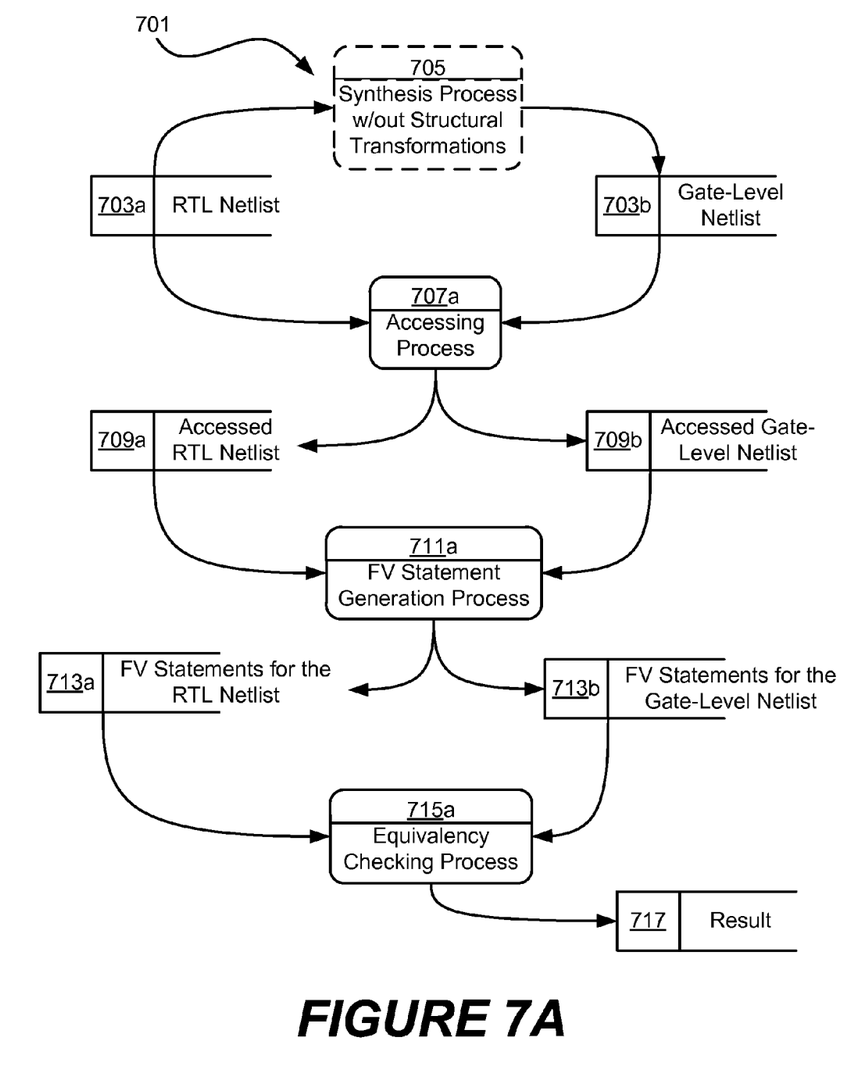
FIGS. 7A and 7B show a data flow diagram illustrating the formal verification of a structurally transformed design according to the method of FIG. 5.
Figure 7B:
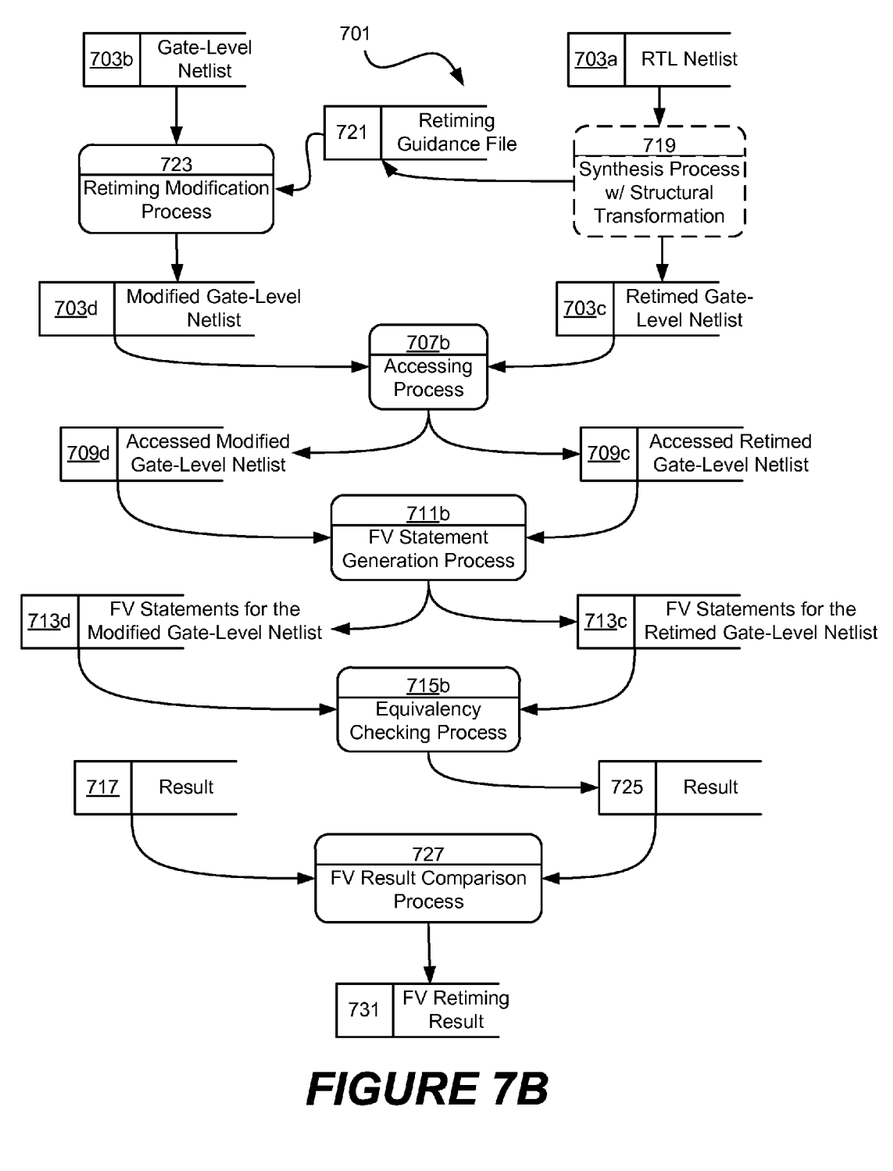

FIG. 5 illustrates a method 501 that may be provided by various implementations of the present invention to formally verify the equivalence of two electronic designs, where one of the designs was synthesized from the other and where the synthesis process included retiming operations. With some implementations, the method 501 may be performed in conjunction with a formal verification tool, such as, for example, the tool 601 illustrated in FIG. 6. FIGS. 7A and 7B illustrate a data flow diagram 701, which depicts the formal verification of two electronic designs by the method 501. Reference to FIGS. 5, 6, 7A and 7B will be made in describing the following illustrative implementations.

As can be seen, the method 501 includes an operation 503 for accessing a first electronic design, and a second electronic design that has been synthesized from the first electronic design, where no structural transformations were performed during the synthesis process. The tool 601 includes a user interface module 603 configured to interact with a user of tool 601. In various implementations, the user interface module 603 may be a graphical display configured to receive inputs from a user and display outputs to a user. With other implementations, the user interface module 603 may be configured to receive inputs from a user and provide outputs to the user through text. In many implementations, the user interface module 603 receives instructions from a user specifying the electronic designs to be formally verified. After which, the user interface module 603 will cause the tool 601 to access the specified electronic designs.

The tool 601 additionally includes an electronic design access module 605 and a hardware description language library 607, which are configured to: read a description for an electronic design from a source, process the description, and make the design description available to the tool 601. As mentioned, the method 501 is performed in conjunction with an electronic design automation tool, such as, for example, the tool 601. The tool 601, in turn, is implemented using a computing device, such as, for example, the computing device 101 illustrated in FIG. 1. As those of skill in the art will appreciate, application of formal verification to modern electronic designs without aid of a computing device is inefficient and arguably impossible. This is due to the size and intricacy of modern electronic designs as well as the complex nature of formal verification. As such, some discussion of how a computing device may be used in conjunction with various implementations of the present invention is given here.

As stated, the method 501 includes the operation 503 for accessing a first and a second electronic design. In various implementations, the operation 503 reads a copy of the first electronic design and the second electronic design into a memory storage location, such as, for example, the system memory 107, where the electronic design will be available to the computing device 101 in a non-transient manner. More specifically, the first and second electronic designs will be available to the computing device 101 until the memory location storing the first and the second electronic designs are released (i.e. allowed to store other data) by the method 501. Furthermore, as indicated above, the various modules of the tool 601 may be implemented as computer-executable instructions, non-transitorily stored on one or more computer-readable media. These modules may then be accessed by the computing device 101 and the instructions executed by the processing unit 105. Additionally, as previously noted, various examples of the invention may be implemented using a computing system, such as the computing device 101 illustrated in FIG. 1. Accordingly, one or more components of each of the various modules of the tool 601 may be implemented by one or more processors in a computing device, executing software instructions, by software instructions stored on a computer readable medium (e.g. the memory 107) for execution, or by some combination of both. It also should be appreciated that, while the user interface module 603, the electronic design accessing module 605, the formal verification sentence generation module 609, the equivalency checking module 613, the retiming guidance interface module 615, and the retiming modification module 619 are shown as separate units in FIG. 6, a single computing system may be used to implement two or more of these modules at different times, or components of two or more of these modules at different times. Still further, although these various modules are illustrated as separate units, it should be appreciate that alternate implementations of the inventions may employ different combinations of the components of these modules. For example, with some alternate implementations of the invention, a unit may incorporate some components of both the retiming guidance interface module 615 and the retiming modification module 619.

The data flow diagram 701 of FIGS. 7A and 7B shows a first electronic design 703*a* and a second electronic design 703*b*. In various implementations, the first electronic design 703*a* is a register transfer level netlist description for an electronic device and the second electronic design 703*b* is a gate-level netlist, which has been synthesized from the design 703*a*, by a synthesis process 705. As can be further seen from this figure, the synthesis process 705 does not apply any structural transformations to the designs 703 during synthesis. More specifically, the synthesis process 705 does not change the component locations within the electronic design during synthesis.

Although the data flow diagram 701 of FIG. 7A illustrates the electronic designs 703 at a particular abstraction level, it is important to note, as indicated above, that the electronic designs 703 may be represented at any level of abstraction and the claimed invention is not specifically limited to the abstraction level depicted in FIG. 7. Furthermore, although FIG. 7 illustrate the synthesis process 705, the synthesis processes 705 may either be carried out in conjunction with various implementations of the invention or as a separate operation. More specifically, in some implementations, the operation 503 may cause the first electronic design to be accessed and then synthesized, wherein the second electronic design would be generated. In alternative implementations, the second electronic design will have already been synthesized from the first electronic design. As such, the operation 503 will access both electronic designs, as described above.

The data flow diagram 701 further illustrates the first electronic design 703*a* and the second electronic design 703*b* being accessed, by an accessing process 707*a*, and subsequently, stored to a memory storage location as a first accessed design 709*a* and a second accessed design 709*b*. In various implementations, the operation 503 causes the first and second electronic designs to be read from a source, processed, and saved to a memory storage location as described above. In alternative implementations, the operation 503 may identify a memory storage location where the first and second electronic designs are already stored, and then record the memory storage location address where the electronic designs are already saved.

The method 501 also includes an operation 505 for generating a set of formal verification statements for the first design and a set of formal verification statements for the second design. As described above, formal verification statements describe the logical operation of a circuit at comparison points throughout the circuit. The tool 601 includes a formal verification statement generation module 609 and a formal verification library 611, which, in combination, are configured to generate a set of formal verification statements for a design. The data flow diagram 701 of FIG. 7A illustrates a formal verification statement generation process 711*a*, which is shown as generating a first set of formal verification statements 713*a* (i.e. that corresponds to the accessed electronic design 709*a* and correspondingly the first electronic design 703*a*) and a second set of formal verification statements 713*b* (i.e. that corresponds to the accessed electronic design 709*b* and correspondingly the first electronic design 703*b*.)

Once the formal verification statements have been generated, the method 501 provides an operation 507 for checking the logical equivalency of the first electronic design to the second electronic design. The tool 601 includes an equivalency checking module 613 configured to apply formal verification proofs to determine if the formal verification statements are logically equivalent and then generate a result of these equivalency checks. As can be seen, the module 613 is configured to utilize the library 611, which may contain formal verification proofs, during the equivalency checking.

As descried previously, many formal verification techniques exist and those of skill in the art will appreciate that they may be applied by the operation 507, in various implementations of the invention, to check the logical equivalency of the first and second electronic designs. The data flow diagram 701 shows an equivalency checking process 715*a* and a generated result 717. The process 715*a* formally verifies the first set of formal verification statements 713*a* and the second set of formal verification statements 713*b*. If the formal verification statements 713*a* and 713*b* are shown to be logically equivalent, then it is assumed that the electronic designs 703*a* and 703*b* are also logically equivalent. With many implementations, the result 717 indicates if the formal verification statements 713*a* and 713*b* are equivalent or not. In some implementations, where the designs 703*a* and 703*b* are found to not be equivalent, the result 717 may list how the designs are not equivalent, such as, for example, by listing which comparison points within the designs 703*a* and 703*b* were not equivalent.

The method 501 additionally includes an operation 509 for accessing a third electronic design, which, like the second electronic design, has been synthesized from the first electronic design, but, where retiming was performed during synthesis of the third electronic design. The method 501 further includes an operation 511 for accessing a retiming guidance file. As indicated above, retiming is the process of structurally modifying an electric design, such as, for example, by moving the location of a register within the design. Typically, retiming operations will include some conditions, such as, for example, area or timing conditions, which the synthesis process will seek to optimize by structurally transforming various parts of the design. The retiming guidance file lists which components were moved where during retiming.

The data flow diagram 701 of FIG. 7B shows a synthesis process 719, which generates a third electronic design 703*c* from the first design 703*a*. As can be seen from this figure, the synthesis process 719 includes retiming, and the third electronic design 703*c* is a retimed gate-level netlist. Furthermore, a retiming guidance file 721 is shown being generated by the synthesis process 719. The tool 601 includes a retiming guidance file interface module 615. As detailed above, the synthesis operations may either be carried out in conjunction with various implementations of the invention, or as a separate process. As such, in some implementations, the retiming guidance file interface module 615 may be configured to identify where the synthesizer (not shown) moves components during synthesis, and record these moves in a retiming guidance file. In alternative implementations, the retiming interface module 615 will be configured to access a retiming guidance file that was previously generated by a synthesis process.

The method 501 further includes an operation 513 for modifying the second electronic design according to the retiming guidance file. The tool 601 includes a retiming modification module 617 and a retiming library 619, which are configured to modify the second electronic design based upon the retiming guidance file. As shown in the data flow diagram 701, the gate-level netlist 703*b* is modified by a retiming modification process 723 and a modified gate-level netlist 703*d* is generated. As detailed above, the retiming guidance file lists which registers were moved during the structural transformation process and to where the registers were moved. As those of skill in the art will appreciate, when components within an electronic design are moved, certain rules must be adhered to in order for the design to perform the same logical function. Furthermore, as the retiming guidance file does not specify "how" the registers are to be moved, but merely specifies to "where" they were moved, the module 617 in conjunction with the retiming library 619 specifies how the registers are to be moved.

It is important to note that, while the rules within the retiming library 619 may be different than the retiming rules implemented during the synthesis process that generates the third electronic design, the logical outcomes should be the same. As those of skill in the art will appreciate, the synthesizer is implementing retiming rules while transforming the first electronic design from a higher level of abstraction (e.g. at the register transfer level) to a lower level of abstraction (e.g. at the gate-level) while the operation 513 is implementing retiming rules on a design already at a lower level of abstraction. As such, the implementations will be different. However, as stated above, the logical outcome of performing the retiming transformations should be the same.

In various implementations, the retiming library 619 may include rules such as the following: when a single register is moved over an inverter, the asynchronous set and reset pins of the register are swapped; when a pair of registers are moved over an AND gate, the two original registers are removed and replaced with a single register; and when a single register is moved to the inputs of an OR gate, the original register is removed and two registers are created and placed at the inputs of the OR gate. The library 619 may include other additional rules, such as, for example, rules that deal with synchronous set and reset, or rules that deal with register fan-out.

The data flow diagram 701 shows an accessing process 707b, which accesses the retimed gate-level netlist 703c and the modified gate-level netlist 703d. As a result, an accessed design 709c and an accessed design 709d are generated, which correspond to the design 703c and the design 703d respectively. The method 501 further includes an operation 515 for generating formal verification statements for the third electric design and the modified second electric design. As can be seen, a formal verification statements generation process 711b is shown, which results in a set of formal verification statements 713c and a set of formal verification statements 713d. As discussed previously, formal verification statements describe the logical operation of a circuit at comparison points throughout the circuit. As such, the formal verification statements 713c and 713d describe the logical operation of the retimed gate-level netlist 703c and the modified gate-level netlist 703d respectively.

The method 501 further includes an operation 517 for checking the logical equivalency of the modified second electronic design and the third electronic design. As can be seen, an equivalency checking process 715b is shown, which formally verifies the set of formal verification statements 713c and 713d and generates a result 725. Similarly to that detailed above, if the set of formal verification statements 713c and 713d are determined to be logically equivalent, then it is assumed that the third design 703c and the modified second design 703d are also logically equivalent. The method 501 then includes an operation 519 for checking the logical equivalency of the third electronic design and the first electronic design. In various implementations, the operation 519 will compare the results from the first formal verification process (i.e. the result from the operation 507) and the second formal verification process (that is the result for the operation 517.)

As can be seen from the data flow diagram 701, a formal verification result comparison process 727 is shown, which compares the result 717 to the result 725 and generates a formal verification retiming result 721. In various implementations, if both the result 717 and the result 725 show logical equivalency between all comparison points, then it will be determined that the first design 703a and the third design 703c are also logically equivalent.

As stated above, various implementations of the invention may be applied to other modification operations, such as, for example, state minimization. Accordingly, although reference was made herein to retiming specific modules and operations, such as, for example, the retiming guidance file 721, that alternative modifications may be substituted without departing from the spirit and scope of the invention.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer-implemented method for performing formal verification, the method comprising:
   accessing a first electronic design;
   accessing a second electronic design, the second electronic design having been synthesized from the first electronic design using a synthesis process that did not include any retiming operations;
   accessing a third electronic design, the third electronic design having been synthesized from the first electronic design using a synthesis process that included one or more retiming operations;
   receiving a retiming guidance file corresponding to the one or more retiming operations;
   implementing a first formal verification process on the first electronic design and the second electronic design, wherein a first result is obtained;
   modifying the second electronic design based in part upon the retiming guidance file;
   implementing a second formal verification process on the modified second electronic design and the third electronic design, wherein a second result is obtained;
   comparing the first result to the second result to generate a comparison result; and
   saving the comparison result to one or more memory storage locations.

2. The computer-implemented method recited in claim 1, further comprising determining if the first electronic design and the third electronic design are logically equivalent based in part on the comparison result.

3. The computer-implemented method recited in claim 2, wherein determining if the first electronic design and the third electronic design are logically equivalent identifies one or more areas of the first electronic design and the third electronic design that are not logically equivalent, the method further comprising:
   generating a report detailing the one or more identified areas; and
   making the report available to a user of the method.

4. The computer-implemented method recited in claim 1, wherein:
   the first electronic design is described at a register transfer level;

the second electronic design is described at a gate-level; and the third electronic design is described at a gate-level.

5. The computer-implemented method recited in claim 1, wherein implementing the first formal verification process on the first electronic design and the second electronic design, comprises:

generating a first set of formal verification statements, the first set of formal verification statements describing a logical operation of the first electronic design;

generating a second set of formal verification statements, the second set of formal verification statements describing a logical operation of the second electronic design; and comparing the first set of formal verification statements and the second set of formal verification statements based in part upon logical proofs.

6. The computer-implemented method recited in claim 5, wherein implementing the second formal verification process on the modified second electronic design and the third electronic design comprises:

generating a third set of formal verification statements, the third set of formal verification statements describing a logical operation of the modified second electronic design;

generating a fourth set of formal verification statements, the fourth set of formal verification statements describing a logical operation of the third electronic design; and comparing the third set of formal verification statements and the fourth set of formal verification statements based in part upon logical proofs.

7. One or more non-transitory computer-readable media, having computer executable instructions stored thereon for performing a formal verification method comprising:

accessing a first electronic design;

accessing a second electronic design, the second electronic design having been synthesized from the first electronic design using a synthesis process that did not include any retiming operations;

accessing a third electronic design, the third electronic design having been synthesized from the first electronic design using a synthesis process that included one or more retiming operations;

receiving a retiming guidance file corresponding to the one or more retiming operations;

implementing a first formal verification process on the first electronic design and the second electronic design, wherein a first result is obtained;

modifying the second electronic design based in part upon the retiming guidance file;

implementing a second formal verification process on the modified second electronic design and the third electronic design, wherein a second result is obtained;

comparing the first result to the second result to generate comparison results; and saving the comparison results to one or more memory storage locations.

8. The one or more non-transitory computer-readable media recited in claim 7, wherein the formal verification method further comprises determining if the first electronic design and the third electronic design are logically equivalent based in part on the comparison results.

9. The one or more non-transitory computer-readable media recited in claim 8, wherein determining if the first electronic design and the third electronic design are logically equivalent identifies one or more areas of the electronic design that are not logically equivalent, and wherein the formal verification method further comprises:

generating a report detailing the one or more identified areas; and making the report available to a user of the non-transitory computer-readable media.

10. The one or more non-transitory computer-readable media recited in claim 7, wherein:

the first electronic design is described at a register transfer level;

the second electronic design is described at a gate-level; and the third electronic design is described at a gate-level.

11. The one or more non-transitory computer-readable media recited in claim 7, wherein implementing the first formal verification process on the first electronic design and the second electronic design comprises:

generating a first set of formal verification statements, the first set of formal verification statements describing a logical operation of the first electronic design;

generating a second set of formal verification statements, the second set of formal verification statements describing a logical operation of the second electronic design; and comparing the first set of formal verification statements and the second set of formal verification statements based in part upon logical proofs.

12. The one or more non-transitory computer-readable media recited in claim 11, wherein implementing the second formal verification process on the modified second electronic design and the third electronic design comprises:

generating a third set of formal verification statements, the third set of formal verification statements describing a logical operation of the modified second electronic design;

generating a fourth set of formal verification statements, the fourth set of formal verification statements describing a logical operation of the third electronic design; and comparing the third set of formal verification statements and the fourth set of formal verification statements based in part upon logical proofs.

* * * * *